United States Patent [19]

Tuutijarvi et al.

[11] Patent Number: 5,524,009
[45] Date of Patent: Jun. 4, 1996

[54] FAST AGC SETTING USING RSS (I) MEASUREMENT PROCEDURE

[75] Inventors: Mika J. Tuutijarvi; Pertti Makikyro, both of Oulu, Finland

[73] Assignee: Nokia Mobile Phones Ltd., Salo, Finland

[21] Appl. No.: 472,855

[22] Filed: Jun. 7, 1995

[51] Int. Cl.$^6$ .................................................. H04B 7/26
[52] U.S. Cl. ...................... 370/95.3; 455/33.2; 375/345; 379/60
[58] Field of Search .......................... 370/13, 17, 95.1, 370/95.3, 85.7; 375/345; 455/33.1, 33.2, 52.1, 53.1, 54.1, 54.2; 379/58, 59, 60, 63

[56] References Cited

U.S. PATENT DOCUMENTS

| | | | |
|---|---|---|---|
| 4,553,086 | 11/1985 | Watanabe et al. | 370/95.3 |
| 4,872,204 | 10/1989 | Hammer et al. | 455/54 |
| 5,142,695 | 8/1992 | Roberts et al. | 455/89 |
| 5,184,349 | 2/1993 | Riordan | 370/95.3 |
| 5,260,943 | 11/1993 | Comroe et al. | 370/95.1 |
| 5,276,685 | 1/1994 | Kepler et al. | 370/95.3 |
| 5,301,364 | 4/1994 | Arens et al. | 370/95.3 |
| 5,331,638 | 7/1994 | Honkasalo et al. | 370/95.1 |
| 5,361,395 | 11/1994 | Yamamoto | 370/95.3 |
| 5,410,733 | 4/1995 | Niva et al. | 455/33.2 |

FOREIGN PATENT DOCUMENTS 1562963  3/1980  Germany.

Primary Examiner—Wellington Chin
Attorney, Agent, or Firm—Perman & Green

[57] ABSTRACT

In a wireless or cellular telephone system operated, for example, in accordance with the TIA/EIA IS-54 TDMA standard specification and frame structure, wherein RSS measurements in a Mobile Station of scanned communication channels are made in the slot intervals between the RX and TX slots to prepare for determining the gain (AGC) values needed in the receiver for a new channel identified over the current channel communicating with a Base Station, wherein slot interval measurements of the new channel signal strength are used to achieve a shorter handoff time in the Mobile Station and a more accurate initial AGC value in the receiver. The new channel signal strength is measured using the existing MAHO measurement procedure according to the IS-54 standard specification, or like procedure, and is performed in three slot intervals. The results of these measurements are used to determine the AGC value needed for the new radio channel. The handoff acknowledgement message is created, interleaved, and sent on the current channel during or after the measurement period.

20 Claims, 2 Drawing Sheets

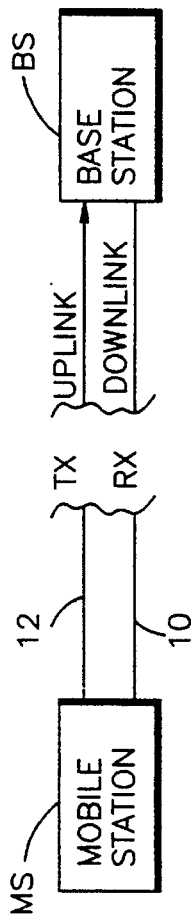
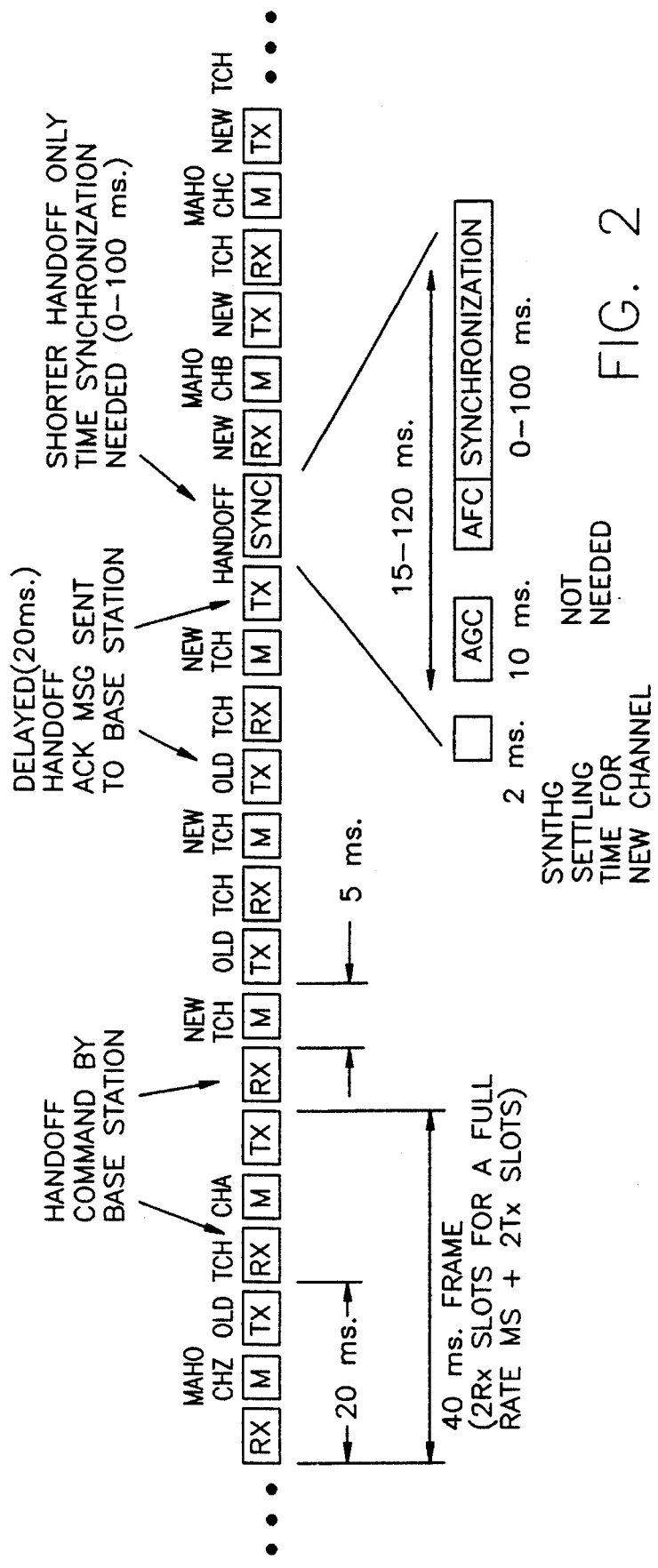

FAST AGC SETTING USING RSS (I) MEASUREMENT PROCEDURE

BACKGROUND OF THE INVENTION

1. Field of the Invention

The present invention relates to mobile or cellular communications and more particularly to a method and means in such communication systems for providing a shorter handoff time at a Mobile Station and an improved gain control (AGC) value in its receiver.

2. Prior Art

The handoff time, i.e., the time taken when a Mobile Station is switching communication from a communication channel currently being received to a new channel in the same or another Base Station, is a critical feature in wireless or cellular phone operation. The handoff clicks or audio mutes will be heard by the user and therefore cellular operators are sensitive about this feature since an extended number of clicks can become annoying and give the impression of poor audio quality.

In accomplishing the handoff, the signal strength of the new channel must be determined in order to suitably adjust the receiver gain (AGC). Some requirements in this regard are set by the radio channel Rayleigh fading which effects the received signal strength (RSS) measurements, and, since the receiver gain (AGC) is adjusted by receiver signal strength information (RSSI), the receiver gain calculations as well. Shortening of the handoff procedure time is partly limited by the receiver Rx gain (AGC) tuning for the new radio channel, and tuning time and accuracy are impacted by the channel fading, so that the fading also effects the handoff. In particular, to deal with the fading, a longer measurement of the new or next communication or traffic channel signal is required for a more accurate AGC determination, since fading effects are minimized or eliminated by longer RSS measurements. The resulting long handoff times will lead to longer handoff clicks or mutes that are undesirably heard by the user.

The same long handoff delay phenomenon, as well as increased bit error rate (BER), may result from the use of the wrong AGC. Wrong gain (AGC) in the receiver may lead to improper signal detection and therefore increase BER or even lead to failure in synchronization in a new communication channel. The need for a new synchronization after such failure will cause extra delay.

Problem to be solved:

Presently, handoff times are typically 15–120 ms depending on the system. Reliable RSS measurement, eliminating the Rayleigh fading effects, contributes to the Rx gain adjustment quality (depending on the mobile speed) and tuning, but may require an unacceptable amount of time. Typical AGC tuning is based entirely on one, approximately 10 ms. measurement period during handoff. This time may be heard by the cellular user and additionally it may not be sufficient for accurate tuning due to the fading effects, i.e., fluctuation in the RSSI. Thus, a problem exists with regard to achieving rapid handoff and accurate initial gain values in the receiver of a Mobile Station when acquiring a new traffic or other communication channel from the old or a new Base Station.

Objects:

It is therefore desirable and an object of the present invention to provide a system with shorter handoff times in a Mobile Station and more accurate initial AGC values in its receiver.

It is a further object of the invention to use RSS measurement methods which will achieve shorter handoff times in the Mobile Station and more accurate initial AGC values in the receiver.

SUMMARY OF THE INVENTION

The present invention involves a method and means in a mobile communication or cellular telephone system wherein the AGC to be used after a handoff procedure is determined by using RSS measurement methods during and based on the handoff procedure. This approach leads to a shorter handoff time in the Mobile Station and a more accurate initial AGC value in the receiver. More particularly, a Mobile Station (MS), upon receiving a handoff command from a Base Station (BS) with which it is communicating, immediately begins to measure the next traffic channel signal strength for fading effect elimination. The measurement is based on the existing Mobile Assisted Handoff (MAHO) measurement procedure in the Mobile Station, or one of the same kind for determining RSSI.

The existing MAHO procedure is a TIA/EIA IS-54 standard specification related RSS measurement function in which various RF channels, from among 24 possible proposed channels, have their signal strength measured by the Mobile Station in response to a command from the Base Station. The results, i.e., the RSSI values, are sent to the Base Station in order to be used in defining a proper handoff channel, and timing, for the handoff procedure. The measured communication channels commanded by the Base Station for MAHO procedure may include: another channel in the commanding Base Station; a traffic channel or a control channel in another proposed Base Station; or any continuous signal, even carrier signals, in other Base Stations. The handoff may be commanded to any channel in a new Base Station, typically not the same channel that is measured in the MAHO procedure. It may be some channel in a Base Station which includes the strongest MAHO channel measured by the Mobile Station.

In normal operation the BS requires the MS to perform RSS measurements for some number of channels, including the current channel, in order to assist in a coming handoff procedure. There is about a 5 ms. "free" time interval between RX and Tx slots (the prescribed receiving and transmitting times) in the IS-54 TDMA frame structure (see FIG. 2). The Rx slot, distinguished by Rx frequency, involves communications from Base Station to Mobile Station (downlink), including speech and control messages, such as the MAHO measurement command. The Tx slot, having its Tx frequency, involves communications from Mobile Station to Base Station (uplink), including some control messages, such as MAHO results, acknowledgements to handoffs, etc. Complete Rx and Tx messages and commands are usually interleaved or distributed respectively over a number of Rx and Tx slots. The 5 ms. "free" time interval between Rx and Tx slots may be used to determine RSSI values in MAHO channels, of different frequency, specified by the Base Station, which interval or measurement period is called a MAHO slot. In accordance with the invention these MAHO slots can be used to determine the signal strength in a new channel specified by the Base Station in the handoff command. During this "free" time interval between the RX and Tx slots the Mobile Station can easily adjust its Rx synthesizers in any Rx channel (differentiated by frequency). After adjusting RF parts in a channel, the MS can sample the received signal using AD-converters. Between the Rx and Tx slots, RF synthesizers are set to the new traffic channel and AGC (Rx gain) is set for the proper value. The signal in the new channel is sampled by the AD-converters and RSS is determined by these samples.

Consequently, this MAHO measurement type of procedure is performed, e.g., at least once, and preferably three times in three slot length intervals, between the RX and TX slots in the US TDMA frame structure. The results of these measurements are used to determine the AGC value needed for the new radio channel, since, once the RSS is known, the correct gain for the receiver is known in order to get the approximately correct signal amplitude for the AD-converters. The handoff acknowledgement message will be created, interleaved, and sent in the Tx slot on the radio channel between these measurements or after this measurement period.

BRIEF DESCRIPTION OF THE DRAWINGS

FIG. 1 is a block diagram of a basic communication system in which the present invention may be incorporated.

FIG. 2 is an illustration of a TDMA frame structure according to the TIA/EIA IS-54 standard specification showing features in accordance with the present invention.

DETAILED DESCRIPTION OF THE PREFERRED EMBODIMENTS

Figure 3:
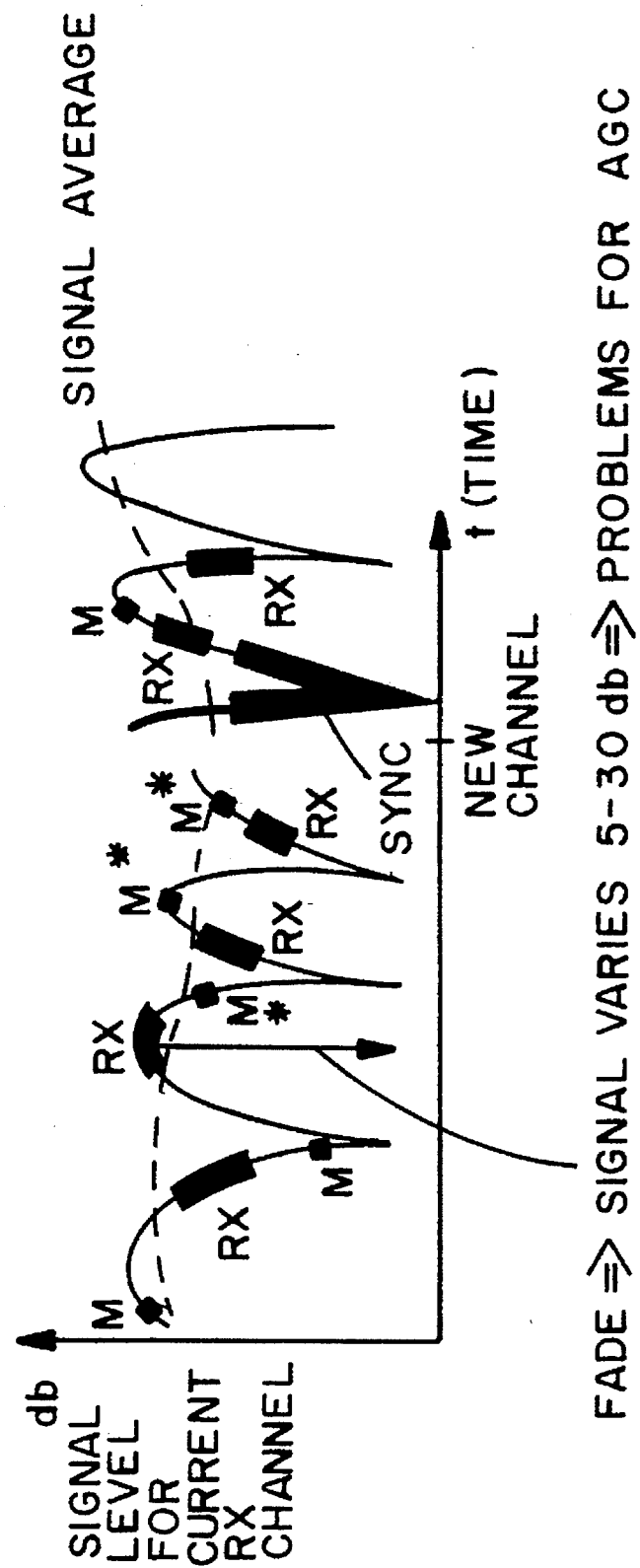
FIG. 3 is a plot of signal level versus time in a current Rx channel illustrating signal variations due to Rayleigh fading.

In mobile communication systems, and particularly the preferred embodiment of cellular phone system in which the present invention is suitable for implementation, a Mobile Station (MS) receives a signal 10 broadcast over an RF channel from a Base Station (BS), such as shown diagramatically in FIG. 1. If the MS is in motion, it may reach a location sufficiently distant from the BS where the signal 10 begins to lose strength at the receiver. At this point it becomes necessary to switch or handoff the MS to another BS, closer to the MS's new location, the received signal from which may be stronger. The handoff procedure is started by a handoff command order in downlink signal 10 from the BS to the MS over the Rx channel in the MS with which it is communicating. The BS waits for the MS handoff acknowledgement (ACK) signal 12 up to 200 ms. according to the system specifications. The decoding of the command order at the MS requires some 20–40 ms., which is partly due to the deinterleaving of the bits of the received signal 10. Thus, there are still about 160–180 ms. for the acknowledgement (ACK) message burst, interleaving, and sending to the BS. The same kind of decoding delay occurs at the BS upon receipt of the uplink acknowledgement message 12, before the actual handoff, although the BS may still transmit speech data for the MS for some time on the current speech channel.

Presently, the Mobile Station (MS), upon receiving a handoff command signal from the Base Station (BS), with which it is currently communicating, begins to measure the prescribed traffic channel signal strength from the next Base Station for fading effect elimination. The measurement is based on the existing Mobile Assisted Handoff (MAHO) measurement procedure that presently consists of an IS-54 standard specification related RSS measurement function in which an RF channel, that is one of a specified number from among 24 possible traffic channels that may be scanned for the purpose, has its signal strength measured by the MS. Alternatively, the measurement procedure may be one of the same kind as the IS-54 specification for determining RSSI, such as the IS-136 standard specification which specifies NL and MACA measurements in digital control channels.

In either event, in accordance with the invention, right after receiving the handoff command, the MS may start to measure the next traffic channel signal strength using the improved measurement method of the invention. More particularly, the actual form of the handoff timing is shown in FIG. 2, which illustrates a TDMA frame structure according to the IS-54 specification, incorporating the features of the invention. In normal operation the BS requires the MS to perform RSS measurements for a number of traffic channels, e.g., CH A, CH B, CH C, . . . CH Z, etc., in order to be prepared for and assist in a coming handoff procedure. As seen in FIG. 2, there is about a 5 ms. "free" time interval between RX and Tx slots during which the Mobile Station can easily adjust its Rx synthesizers in any Rx channel (which are differentiated by receivable frequency), and after adjusting RF parts in a channel, the MS can sample the received signal using AD-converters. This sampling time is marked as an MAHO slot, M, in FIG. 2 in the IS-54 TDMA frame structure. As noted, normally these separate slots M are used to successively determine RSSI for those channels specified in a MAHO measurement command by the BS, e.g., channels CH Z and CH A. In accordance with the invention these MAHO slots can be used to determine signal strength in a newly commanded channel instead.

Presently, as illustrated in FIG. 2, the signal strength of the new channel is determined during the handoff period, over about a 10 ms. AGC slot prior to the synchronization slot. The handoff period, which may range between about 15 and 120 ms., normally involves an approximately 2 ms. slot for synthesizing a settling time for the new channel, an approximately 10 ms. AGC slot, and a synchronization slot introduced by an AFC portion. The synchronization slot size, which may range from 0 to about 100 ms., depends on the timing of the MS finding the correct Rx slot for the Rx frequency (time synchronization) in the new BS, which time is typically not known before conducting the synchronization procedure. The AGC measurement for the new channel signal must be accomplished within the comparatively brief period of about 10 ms. However, as seen in FIG. 3, which illustrates signal level variation in a Rayleigh fading environment with an MS moving at low velocity, Rayleigh fading, of up to about 30 db, may result. This is due to multipath signal propagation, since separate signals may increase or decrease the total signal strength depending on the signal phases in the receiver antenna. It will be seen that the first signal measurement (M) for the new channel may provide only a rough estimate of the RSS because the first Rx gain may be inadequate and/or the received signal may be corrupted by Rayleigh (multipath) fading effects. Hence, it may be necessary or advisable to perform more measurements in a longer time interval in order to acquire a more reliable RSS estimate for the channel being measured at the time. This is accomplished by the invention through using one or more of the MAHO slots, rather than the AGC slot during the handoff. The measurement results, in such instance, are averaged and the handoff time period may be shortened by eliminating the AGC slot. The AFC preceding the synchronization slot also may not be needed. Additionally, the handoff acknowledgement (ACK) message may be delayed somewhat to permit the measuring, as shown in FIG. 2.

In the "free" time intervals between separate Rx and Tx slots, RF synthesizers in the MS are set to the new channel and the AGC (Rx gain) is set for the proper value. The signal in the new traffic channel is sampled by AD-converters during the M slots and RSS is determined by these samples. Consequently, the RSS measurement procedure is performed, e.g., at least once, but preferably three times in three M slot length intervals, between the RX and TX slots in the US TDMA frame structure, prior to handoff. The results of these measurements are used to determine the AGC value needed for the new traffic (or radio) channel, since, once the RSS is known, the correct gain for the receiver is known in order to get the approximately correct signal amplitude for the AD-converters. The handoff acknowledgement (ACK) message will be created, interleaved, and sent on the current radio channel during or after this measurement period.

While, as noted, a single M slot measurement might be sufficient, elimination of the fading effect may normally require at least three measurements in 20 ms. intervals (the slot length in US TDMA), so that the complete measurement time may be about 60 ms. The resultant RSS level is used to determine the AGC value needed for the new channel, i.e., the RF signal level can be calculated based on the known RF gain and the calculation of the power in the received signal samples. All the RSSI measurements are performed between the RX and TX slots in the TDMA frame structure. During these measurements speech signals and audios are active in normal operation. The cellular user will hardly notice the handoff clicks (audio mutes). The handoff acknowledgement message sent to the Base Station is delayed only a little or not at all and the procedure may be effective in both directions.

An alternative to the preceding preferred embodiment is to have the Base Station inform the Mobile Station about the new traffic channel before commanding the handoff. The informing message may be a kind of modified MAHO measurement command, with information that the following channel in the scan is to be the next traffic channel after handoff, so as to leave additional time before handoff. With this approach the measurement period is made remarkably longer and thus the AGC value will be more accurate. This method would need specification updates and would require that in the new traffic channel, the carrier transmitting power be ON in the BS.

In other cases where the normal (current) standard method may be implemented, if the carrier is not set ON in the next traffic channel, the RSS can not be immediately measured for the lack of a signal. The invention in such a case may not be operated reliably, because the signal may be switched ON too late in the next channel. In such event, the handoff may be a bit longer, or some extra delay may be added before the handoff acknowledgement is sent, in order to await the carrier in the new channel.

The present invention may be readily implemented in current mobile phone systems. A useful feature is its application especially when an IS-136 based DELTA TIME parameter is being used, in that handoff times are relatively smaller which poses requirements for faster AGC.

What is claimed is:

1. In the method for providing a handoff between communication channels in a Mobile Station using TDMA frame structure communications, wherein RSS measurements of scanned channels are made in the slot intervals between the RX and TX slots to prepare for determining the gain (AGC) values needed in the receiver for a new channel that is identified in the current channel communicating with a Base Station, the improvement comprising the steps of:

upon receiving an identification of a new communication channel over a current communication channel at the Mobile Station, beginning measuring the signal strength of the new channel identified using RSS measuring based on a handoff signal measurement procedure;

performing said measuring in the slot intervals between the RX and TX slots in the said TDMA frame structure, for fading effect elimination; and determining the AGC value needed for the new channel upon handoff based on said measuring.

2. The method of claim 1 wherein said measuring performing step comprises performing said measuring in three slot intervals.

3. The method of claim 2 wherein said AGC value is determined from the average value of the measurements obtained in said three slot intervals.

4. The method of claim 1 wherein said measuring performing step is performed over a measurement period and further comprising the step of creating, interleaving, and sending a handoff acknowledgement message on the current communication channel during or after said measurement period.

5. The method of claim 1 wherein said RSS handoff signal measurement procedure comprises the existing MAHO measurement procedure according to the TIA/EIA IS-54 standard specification.

6. The method of claim 1 wherein said RSS handoff signal measurement procedure comprises a procedure of the same kind as the existing MAHO measurement procedure according to the TIA/EIA IS-54 standard specification.

7. The method of claim 6 wherein said RSS handoff signal measurement procedure comprises the existing MAHO measurement procedure according to the TIA/EIA IS-136 standard specification.

8. The method of claim 1 wherein the identification of the new communication channel is transmitted from the Base Station to the Mobile Station in an informing message over the current communication channel before the handoff command.

9. The method of claim 8 wherein said informing message comprises a modified MAHO measurement command, with information that the following channel is to be the next traffic channel after handoff.

10. A system for providing a handoff between communication channels in a Mobile Station using TDMA frame structure communications, wherein RSS measurements of scanned channels are made in the slot intervals between the RX and TX slots to prepare for determining the gain (AGC) values needed in the receiver for a new channel that is identified over the current channel communicating with a Base Station, comprising:

means, responsive to the receipt of a communication on a current channel at the Mobile Station identifying a new communication channel, for measuring the new communication channel signal strength for fading effect elimination using RSS measuring based on a handoff signal measurement procedure;

means for performing said RSS measuring in the slot intervals between the RX and TX slots in said TDMA frame structure; and means for determining the AGC value needed for the new communication channel upon handoff using the results of said RSS measuring in the slot intervals.

11. The system as in claim 10 further comprising means for creating, interleaving, and sending a handoff acknowledgement message on the current communication channel during or after said RSS measuring.

12. The system as in claim 10 wherein said performing means comprises means for performing said RSS measurements in three slot intervals.

13. The system as in claim 12 wherein said means for for determining said AGC value comprises means for determining the average value of the measurements obtained in said three slot intervals.

14. The system as in claim 10 wherein said communication is a handoff command identifying the new communication channel and said measuring means comprises means for immediately beginning the new channel RSS measurements upon receipt of said handoff command.

15. The system as in claim 10 wherein said communication is an informing message identifying the new communication channel before the handoff command and said measuring means comprises means for immediately beginning the new channel RSS measurements upon receipt of said informing message.

16. The system as in claim 15 wherein said informing message comprises a modified MAHO measurement command with information that the following channel is to be the new channel after handoff and said measuring means comprises means for immediately beginning the RSS measurements for the following channel.

17. In an apparatus for producing a handoff between communication channels in a Mobile Station using TDMA frame structure communications, comprising:

a plurality of receivers in the Mobile Station for respectively communicating over a plurality of communication channels with a Base Station;

means for producing and receiving message signals with said TDMA frame structure over said communication channels; and means for conducting RSS measurements of the message signals in successive channels during the slot intervals between the RX and TX slots in said TDMA frame structure to prepare for determining the gain (AGC) values needed in the receiver for a new communication channel that is identified in a message signal over the current channel communicating with the Base Station;

wherein the improvement comprises:

means, responsive to the receipt of a message signal on the current communication channel identifying a new communication channel, for measuring the new communication channel signal strength using RSS measuring in the slot intervals between the RX and TX slots in said TDMA frame structure; and means for determining the AGC value needed in the receiver for the new communication channel upon handoff using the results of said RSS measuring in the slot intervals.

18. Apparatus as in claim 17 wherein said measuring means comprises means for performing said RSS measuring in three slot intervals.

19. Apparatus as in claim 18 wherein said determining means comprises means for determining said AGC value from the average value of the measurements obtained in said three slot intervals.

20. Apparatus as in claim 17 wherein said measuring means performs said RSS measuring over a measurement period and further comprising means for creating, interleaving, and sending a handoff acknowledgement message on the current communication channel during or after said measurement period.

* * * * *